United States Patent [19]
Campbell

[11] 4,224,569
[45] Sep. 23, 1980

[54] DISPLAY STABILIZATION CIRCUIT
[75] Inventor: Eugene H. Campbell, Morgan Hill, Calif.
[73] Assignee: National Semiconductor Corporation, Santa Clara, Calif.
[21] Appl. No.: 920,222
[22] Filed: Jul. 19, 1978
[51] Int. Cl.² ............................................. G01R 23/02
[52] U.S. Cl. ................................. 324/78 D; 324/77 A
[58] Field of Search ................ 324/78 R, 78 D, 77 A, 324/99 D; 235/92 EA

[56] References Cited
U.S. PATENT DOCUMENTS
3,735,387  5/1973  Miller ................................ 324/78 D

*Primary Examiner*—Michael J. Tokar
*Attorney, Agent, or Firm*—Brown & Martin

[57] ABSTRACT

A stabilized display for electronic instruments that make voltage measurements, frequency measurements, and the like is disclosed. This stabilized display includes a counter, a register, a comparator, and control logic. The counter generates counts, during spaced apart time intervals, that are representative of measurements made by the instrument. Selected ones of these counts are transferred to the register in response to a LATCH signal, where they are displayed. The comparator connects to the counter and the register. It generates output signals indicating whether or not the contents of the counter and register are equal. These output signals are received by the control logic, which generates the LATCH signal in response to a predetermined sequence of non-equality indications from the comparator.

9 Claims, 4 Drawing Figures

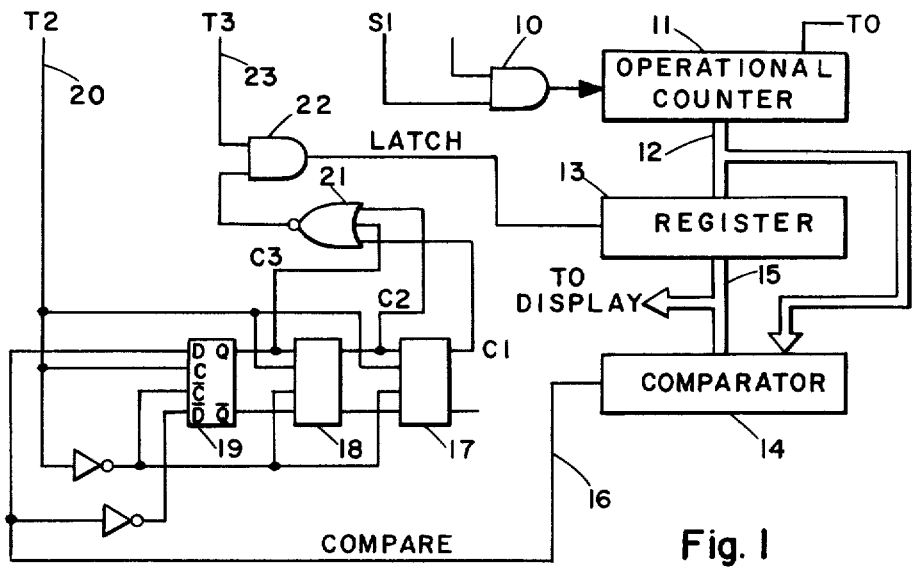
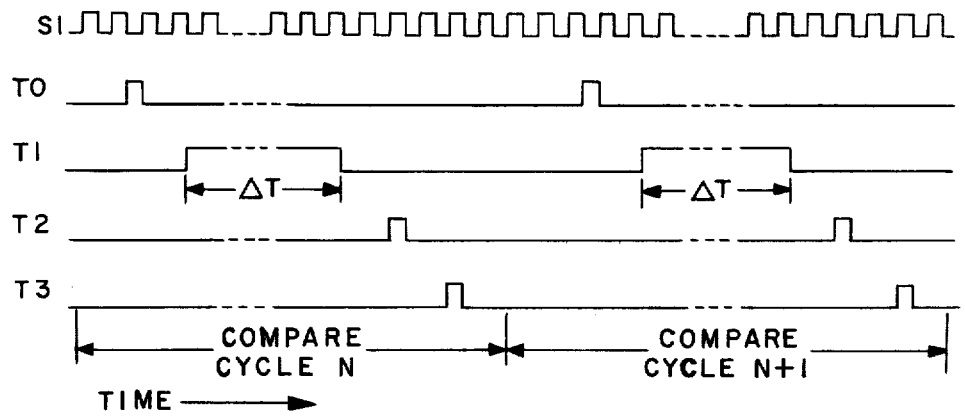
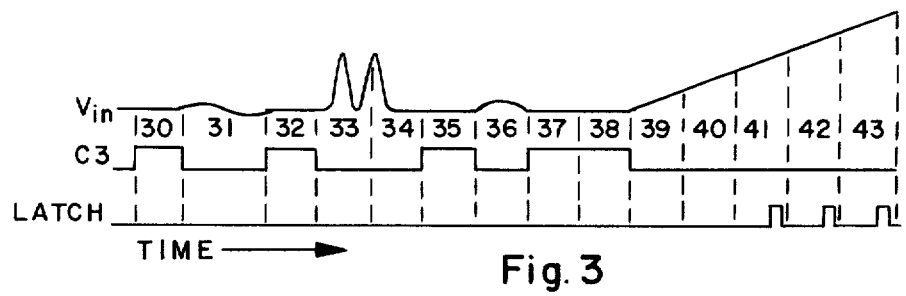

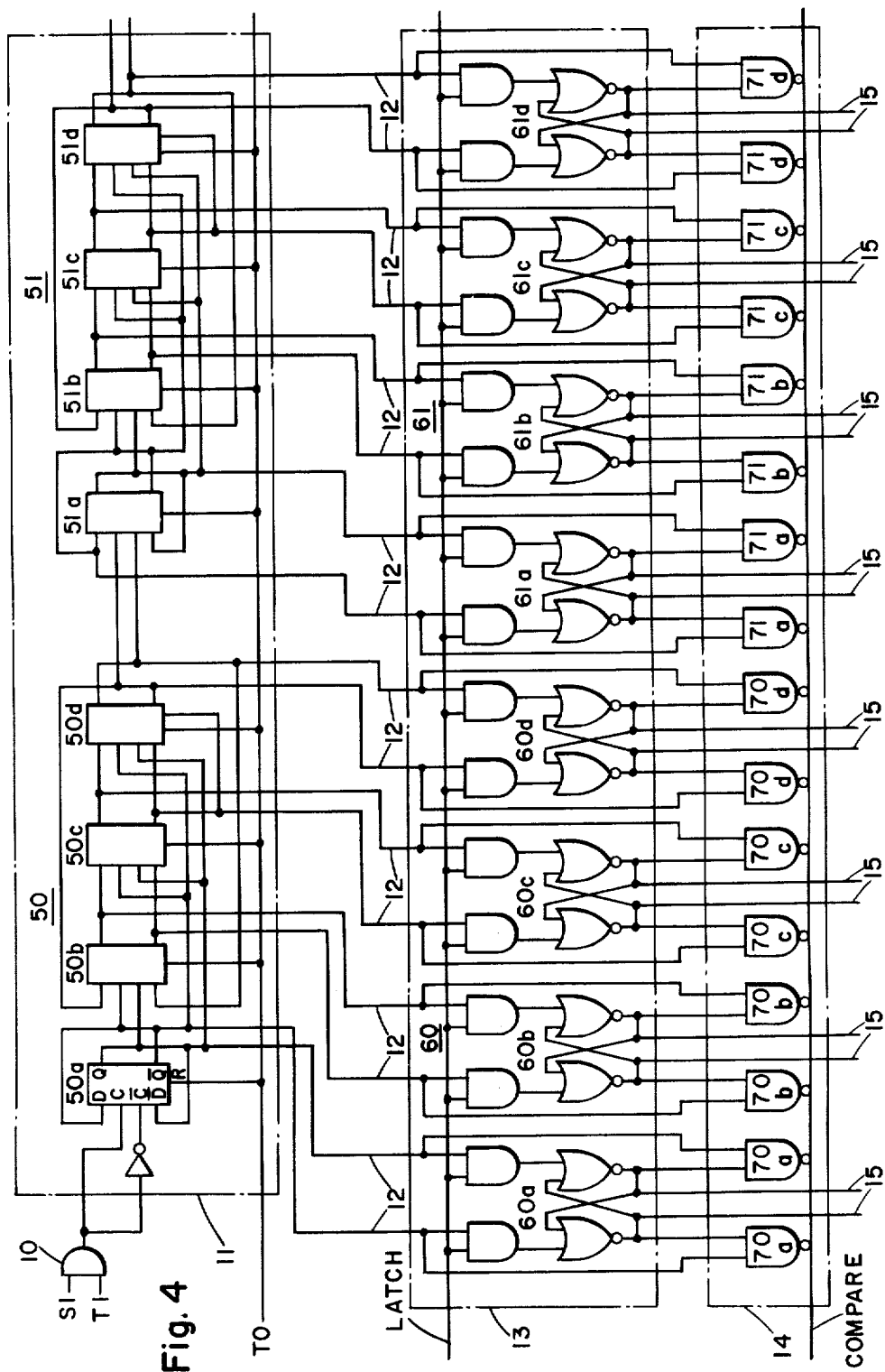

DISPLAY STABILIZATION CIRCUIT

BACKGROUND OF THE INVENTION

This invention relates to electronic measuring instruments, and more particularly to digital display circuitry for such instruments. In the prior art, a wide variety of electronic measuring instruments having digital readouts exist. These include for example, dual slope volt meters, ohmmeters, current meters, and frequency meters.

Many differences in design exist among these various meters. Basically, however, they each include a counter, which generates counts during spaced apart time intervals, that are representative of the measurements made. Each of these counts are stored in a register; and the output of the register drives a digital display.

One problem however, with such a digital display, is that the displayed characters tend to be unstable. That is, due to a variety of conditions, the displayed characters tend to flicker about some nominal or average value. This flickering is distracting and also causes the display to be difficult to read.

One source of this display instability is random noise on the input signal. Random noise causes intermittent variations in the input signal, which in turn causes intermittent variations in the counts that are generated. Thus the display flickers because all of the different counts are transferred into the register.

Variations in the time base generator can also cause flickering in the display. That is, small variations in the time intervals during which the counter is enabled produces corresponding variations in the counts generated.

These and other sources of display instability are particularly distracting when the signal being measured has a nominal value that makes several of the least significant digits of the display equal to 9. In such a case, intermittent noise and time base errors that cause a variation of only one bit in the counter, produces a flickering in all of the 9 digits in the display.

In the prior art, one approach that has been taken to solve the above problem is to perform a time averaging on the contents of the operational counter, and to display only the time averaged count. For example, four consecutive measurements may be made; and the average of these measurements can be calculated by dropping the least significant two bits. Such time averaging does in fact reduce flicker in the display.

A problem however, with such time averaging, is that the instrument cannot readily track a rapidly changing input signal. For example, if four consecutive measurements are time averaged, then the instrument will update its display at only ¼ the rate at which it would if no averaging were used. Thus, in the prior art, a trade off existed between display stability and ability to track rapidly changing signals.

Accordingly, it is one object of the invention to provide an improved display circuit for an electronic measuring instrument.

Another object of the invention is to provide a stabilized display for an electronic measuring instrument which does not time average.

Still another object of the invention is to provide a stabilized display for an electronic measuring instrument which can readily track rapidly changing input signals.

SUMMARY OF THE INVENTION

These and other objects are accomplished in accordance with the invention by an electronic instrument that includes a counter for counting clocking signals during spaced apart time intervals to generate a count in each of the intervals which is representative of a measurement made by the instrument. A register is connected to selectively store the output of the counter in response to a LATCH signal; and a digital display is connected to the output of the register. The LATCH signal is generated only in response to a predetermined sequence of miscompares between the contents of the register and the operational counter.

A comparator connects to the output of the register and the counter. This comparator generates an output signal indicating whether or not the contents of the register and counter are equal. A predetermined number of the most recently generated output signals are stored in a shift register. These stored output signals are used to generate the LATCH signal.

In one embodiment, three consecutive miscompares generate the LATCH signal. In another embodiment, the LATCH signal is generated whenever two of the last three output signals indicated a miscompare. Preferably, between two and five consecutive output signals from the comparator are utilized to decide whether or not a LATCH signal should be generated.

BRIEF DESCRIPTION OF THE DRAWINGS

Various preferred embodiments of the invention will best be understood by referring to the Detailed Description when read in conjunction with the accompanying drawings, wherein:

FIG. 1 is a logic diagram of a stabilized display constructed according to the invention.

FIG. 2 is a timing diagram illustrating the operation of the display of FIG. 1.

FIG. 3 is another timing diagram illustrating the operation of the display of FIG. 1.

FIG. 4 is a detailed logic diagram of the counter, register, and comparator which comprises a portion of the display of FIG. 1.

DETAILED DESCRIPTION

One preferred embodiment of the invention will now be described in conjunction with FIG. 1. This embodiment includes an AND gate 10 and an operational counter 11. Counter 11 is reset periodically by a signal T0, and subsequently counts pulses from gate 10. This gate has inputs coupled to receive a timing signal T1 and a clocking signal S1. All of these signals are illustrated in the timing diagram of FIG. 2.

Basically, signal T1 goes high at spaced apart time intervals $\Delta T$ to enable clocking signal S1 to pass through gate 10 and generate a count in counter 11 during each of the intervals. Each count is representative of a measurement made by the instrument. For example, the number of pulses of signal S1 which occur during time interval $\Delta T$ may be representative of a measured voltage or frequency. Suitably, signal S1 is in the megahertz range; and time interval $\Delta T$ is on the order of several milliseconds. Either the frequency of signal S1 or the width of time interval $\Delta T$ may vary in accordance with the information that is being measured.

Also in the FIG. 1 embodiment, a data bus 12 connects the output of counter 11 to the input of a register 13 and a comparator 14. Further, the output of register 13 couples via another bus 15 to a display and to a second input of comparator 14. In operation, register 13 stores selected ones of the counts generated in counter 11 in response to a LATCH signal.

A primary object of the invention is to generate this LATCH signal such that the display connected to bus 15 is stabilized. At the same time, the update rate of register 13 must not be unduly limited. To this end, comparator 14 is included to generate a COMPARE signal which indicates whether or not the contents of register 13 and counter 11 are equal. Specifically, a high logic level on a lead 16 indicates that the contents of counter 11 and register 13 compare; while a low logic level indicates a miscompare.

Three flip-flops 17, 18 and 19, interconnected as a shift register having an input coupled to receive the COMPARE signal, are also included in the FIG. 1 embodiment. These flip-flops are clocked after each of the time intervals $\Delta T$ by a timing signal T2 on a lead 20. Accordingly, flip-flops 17, 18 and 19 have output signals which indicate the last three comparisons made by comparator 14. These signals are labelled C1, C2 and C3.

Based on these signals, a decision is made as to whether or not to generate the LATCH signal. In the preferred embodiment illustrated in FIG. 1, the LATCH signal is generated only when all of the signals C1, C2 and C3 are low. This, of course, indicates that all of the last three comparisons resulted in a miscompare.

A NOR gate 21 and an AND gate 22 are interconnected as illustrated in FIG. 1 to generate the LATCH signal from signals C1, C2 and C3. Gate 22 also receives a timing signal T3 on a lead 23, and signal T3 synchronizes the LATCH signal with respect to the other timing signals T0, T1 and T2. All of the timing signals may be provided by any suitable source of periodic signals synchronized by a clock (not shown in the drawings).

The manner in which the FIG. 1 circuit operates over several comparison cycles is illustrated in FIG. 3. In this Figure, reference numerals 30-43 indicate a plurality of comparison cycles. A signal $V_{in}$ illustrated as an example of a voltage that the instrument is measuring. Also illustrated are signal C3 and LATCH.

As described above, in order to generate the LATCH signal, three consecutive miscompares must occur. In other words, signal C3 must be low for three consecutive compare cycles. Thus, as illustrated in FIG. 3, the intermittent miscompares which occur during compare cycles 31, 33, 34 and 36 do not generate a LATCH signal. These intermittent miscomparisons may be due to noise spikes, such as those occurring during time intervals 33, 34 and 36; or they may be due to time base errors such as those occurring during time interval 31. This time base error is greatly exaggerated for illustrative purposes; and actually may only be several nanoseconds. Clearly, suppression of the LATCH signal during the compare cycles 30-38 produces the desired effect of stabilizing the display.

In comparison, the latch signal is generated during compare cycles 41-43. These latch signals are generated in response to a ramping up of the input signal $V_{in}$. Rapid changes in signal $V_{in}$ will be tracked by the disclosed display circuit because the latch signal can be generated in consecutive compare cycles. That is, once three consecutive miscompares occur, the disclosed circuit will update the display once for each subsequent miscompare that occurs. This is illustrated in compare cycles 41, 42 and 43. Thus, even though the display is stabilized, no penalty is paid in the form of a lowering of the maximum display update rate.

Referring now to FIG. 4, one preferred embodiment of counter 11, register 13, and comparator 14 will be described. In this Figure, counter 11 is a decimal counter. Only the units stage 50 and the tens stage 51 are shown. Additional stages may also be included in counter 11 by repeating the illustrated pattern. Each of the stages 50 and 51 is comprised of four D flip-flops. These are labelled 50a-50d and 51a-51d. These flip-flops have clocking inputs labelled C and $\overline{C}$, data inputs labelled D and $\overline{D}$, and a reset input labelled R. Flip-flops 50a-50d and 51a-51d are interconnected as illustrated to form respective divide-by-10 counters.

Similarly, in FIG. 4, register 13 includes two stages 60 and 61. Stage 60 consists of four flip-flops 60a-60d; and stage 61 consists of four flip-flops 61a-61d. Each of these flip-flops consists of a pair of cross coupled NOR gates and a pair of input AND gates. In operation, the LATCH signal enables the signals on leads 12 to pass through the AND gates and set the cross coupled NOR gates in accordance with the signals on leads 12.

Comparator 14 is comprised of a plurality of NAND gate pairs 70a-70d and 71a-71d. That is, two NAND gates are provided for each of the flip-flops within register 13. Each of these NAND gates has two inputs. These inputs are connected to opposite sides of corresponding flip-flops within register 13 and counter 11. Thus, when both of the inputs of any of the NAND gates are both high, this indicates a miscompare condition. The NAND gate which has two high input signals indicates this miscompare condition by forcing its output low. This in turn forces the COMPARE signal low, because the output of the NAND gates are tied together in a wire OR fashion.

Various preferred embodiments of the invention have now been described in detail. It is to be understood, however, that many changes and modifications can be made to the above described details without departing from the nature and spirit of the invention. For example, while the signal being measured in FIG. 3 was described as a voltage, the analysis there also applies to various other input signals such as those representing a current or frequency.

Further, various other sequences of non-equality indications from comparator 14 may be utilized to generate the LATCH signal. For example, logic gates 21 and 22 may be replaced by other logic gates which generate a LATCH signal when at least two of the signals C1, C2 and C3 indicate a miscompare. In general, the LATCH signal would be generated when at least 50% of the stored COMPARE signals indicated a miscompare.

As to another alternative, it is to be understood that any number of flip-flops may be used to sample and hold the COMPARE signals. Preferably, the number of samples of the COMPARE signal that is held and used to generate a LATCH signal is between two and five inclusive.

Further, it is to be understood that any logic circuitry having memory may be utilized to sample and hold the COMPARE signal. In other words, signals such as C1, C2 and C3 need not be stored in a shift register.

Therefore, since many changes and modifications can be made to the above described details, it is to be understood that the invention is not limited to said details, but is defined by the appended claims.

Having described my invention, I now claim:

1. An electronic instrument having a stabilized display, said instrument comprising:
   counter means for counting clocking signals during spaced apart time intervals to generate a count in each of said intervals representative of a measurement made by said instrument;
   register means coupled to said counter means for storing selected ones of said counts in response to a LATCH signal;
   display means coupled to said register means for visually displaying characters representative of the count held in said register means;
   comparator means coupled to said counter means and to said register means for generating an output signal between each of said time intervals indicating whether or not the contents of said counter means and said register means are equal; and
   control means for generating said LATCH signal in response to a predetermined sequence of non-equality indications from said comparator means, and for generating said LATCH signal for each successive non-equality indication from said comparator means after said predetermined sequence.

2. An instrument according to claim 1, wherein said control means includes means for holding a predetermined number of the most recently generated output signals, and means for generating said LATCH signal in response to all of said held output signals indicating a miscompare.

3. An instrument according to claim 2, wherein said means for holding said output signals is a shift register.

4. An instrument according to claim 2, wherein said predetermined number is between 2 and 5 inclusive.

5. An instrument according to claim 1, wherein said control means includes means for holding a predetermined number of the most recently generated output signals, and means for generating said LATCH signal in response to at least 50% of said held output signals indicating a miscompare.

6. An instrument according to claim 5, wherein said means for holding said output signals is a shift register.

7. An instrument according to claim 5, wherein said predetermined number is between 2 and 5 inclusive.

8. An instrument according to claim 1, wherein said counter means generates a count in each of said time intervals representative of a measured voltage.

9. An instrument according to claim 1, wherein said counter means generates a count in each of said time intervals representative of a measured frequency.

* * * * *